(12) United States Patent
Lee

(10) Patent No.: US 11,430,807 B2
(45) Date of Patent: Aug. 30, 2022

(54) THREE-DIMENSIONAL MEMORY DEVICE INCLUDING WORD LINE INCLUDING POLYSILICON AND METAL

(71) Applicant: SAMSUNG ELECTRONICS CO., LTD., Suwon-si (KR)

(72) Inventor: Jaegoo Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 237 days.

(21) Appl. No.: 16/885,597

(22) Filed: May 28, 2020

(65) Prior Publication Data

US 2021/0233928 A1 Jul. 29, 2021

(30) Foreign Application Priority Data

Jan. 23, 2020 (KR) .................. 10-2020-0009184

(51) Int. Cl.
| | |
|---|---|
| *H01L 27/11582* | (2017.01) |
| *H01L 27/11565* | (2017.01) |
| *H01L 27/11573* | (2017.01) |
| *H01L 27/11519* | (2017.01) |
| *G11C 7/18* | (2006.01) |

(Continued)

(52) U.S. Cl.
CPC ........ *H01L 27/11582* (2013.01); *G11C 7/18* (2013.01); *G11C 8/14* (2013.01); *H01L 23/5226* (2013.01); *H01L 27/11519* (2013.01); *H01L 27/11526* (2013.01); *H01L 27/11556* (2013.01);

(Continued)

(58) Field of Classification Search
CPC .......... H01L 27/11582; H01L 23/5226; H01L 27/11519; H01L 27/11526; H01L 27/11556; H01L 27/11565; H01L 27/11573; H01L 27/11575; H01L 27/11578; H01L 29/40117; H01L 27/11578; H01L 23/5283; H01L 23/53271; H01L 27/1157; G11C 7/18; G11C 8/14
See application file for complete search history.

(56) References Cited

U.S. PATENT DOCUMENTS

| | | |
|---|---|---|
| 8,304,348 B2 | 11/2012 | Hashimoto |
| 8,461,566 B2 | 6/2013 | Tang |

(Continued)

FOREIGN PATENT DOCUMENTS

| | | |
|---|---|---|
| JP | 2011-35237 A | 2/2011 |
| KR | 10-2017-0035629 A | 3/2017 |
| KR | 10-2019-0006142 A | 1/2019 |

*Primary Examiner* — Allison Bernstein
(74) *Attorney, Agent, or Firm* — Lee IP Law, P.C.

(57) ABSTRACT

A 3D memory device and a method of manufacturing the same, the device including a substrate including a cell and an extension region; a cell stack including insulation layers and word lines alternately stacked on the substrate; channel structures vertically passing through the cell stack; a word line separation layer vertically passing through the cell stack and extending lengthwise in a first direction; a contact plug vertically connected to the word lines on the extension region; and a bit line extending lengthwise in a second direction on the channel structures, wherein each of the word lines includes an inner pattern including polysilicon; and an outer pattern including metal, the outer pattern surrounds an outer surface of the inner pattern, the channel structures vertically pass through the inner pattern, and the contact plug is on the outer pattern.

20 Claims, 17 Drawing Sheets

(51) Int. Cl.
*H01L 27/11556* (2017.01)
*H01L 23/522* (2006.01)
*G11C 8/14* (2006.01)
*H01L 27/11526* (2017.01)

(52) U.S. Cl.
CPC .. *H01L 27/11565* (2013.01); *H01L 27/11573* (2013.01)

(56) References Cited

U.S. PATENT DOCUMENTS

| | | |
|---|---|---|
| 9,029,938 B2 | 5/2015 | Nakaki |
| 9,373,540 B2 | 6/2016 | Hyun |
| 9,620,511 B2 | 4/2017 | Lee et al. |
| 10,079,203 B2 | 9/2018 | Son et al. |
| 10,192,929 B2 | 1/2019 | Mori |
| 10,395,982 B2 | 8/2019 | Nam et al. |
| 10,916,563 B2 * | 2/2021 | Kim ............... H01L 27/11548 |
| 2019/0326166 A1 | 10/2019 | Nam et al. |
| 2021/0125928 A1 * | 4/2021 | Kim ............... H01L 21/76816 |

* cited by examiner

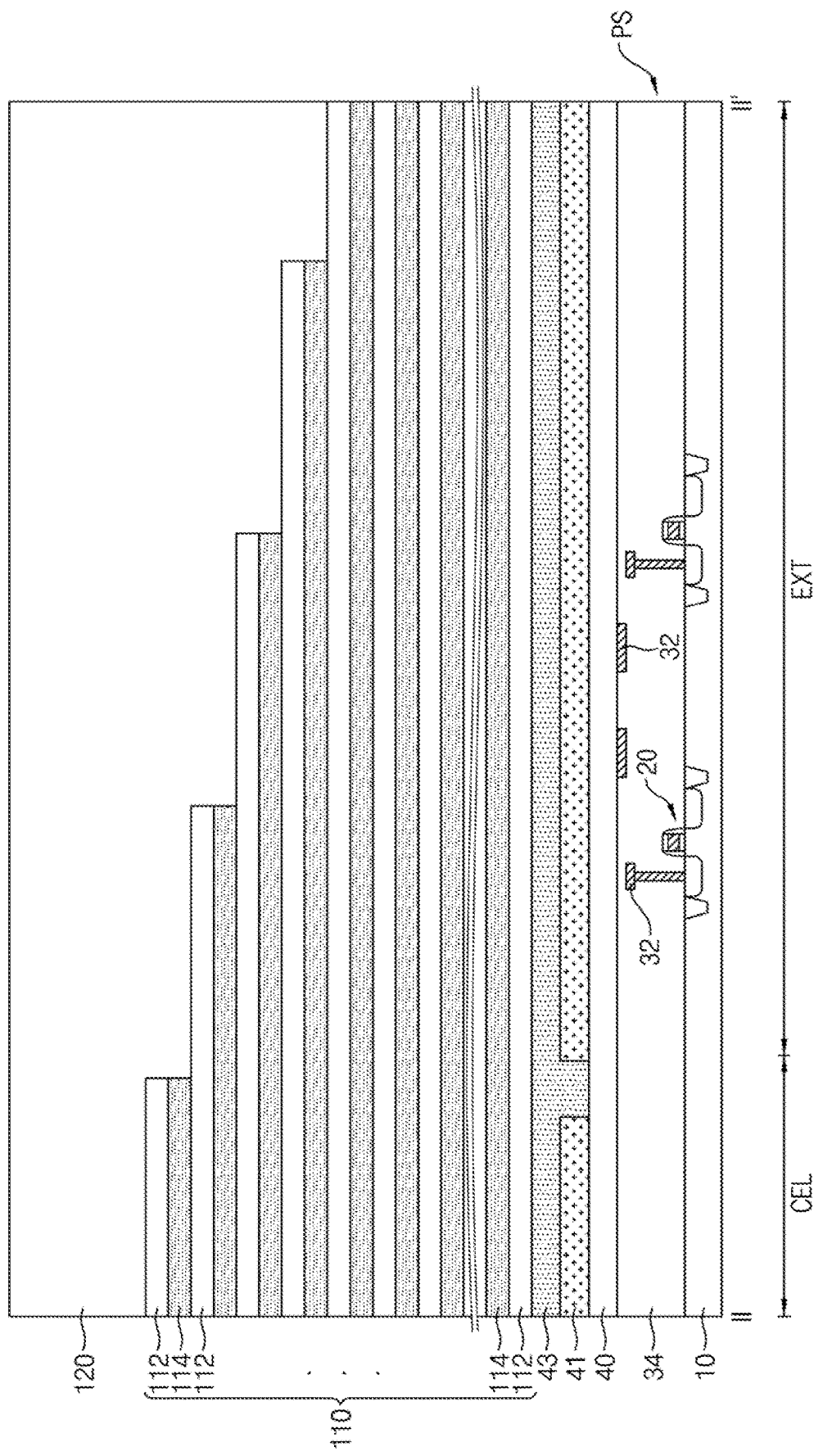

THREE-DIMENSIONAL MEMORY DEVICE INCLUDING WORD LINE INCLUDING POLYSILICON AND METAL

CROSS-REFERENCE TO THE RELATED APPLICATION

Korean Patent Application No. 10-2020-0009184, filed on Jan. 23, 2020, in the Korean Intellectual Property Office, and entitled: "3D Memory Device Including Word Line Including Polysilicon and Metal," is incorporated by reference herein in its entirety.

BACKGROUND

1. Field

Embodiments relate to three-dimensional (3D) memory device including a word line including polysilicon and a metal.

2. Description of the Related Art

A 3D memory device may use a word line including polysilicon.

SUMMARY

The embodiments may be realized by providing a three-dimensional (3D) memory device including a substrate including a cell region and an extension region; a cell stack including a plurality of insulation layers and a plurality of word lines alternately stacked on the substrate; a plurality of channel structures vertically passing through the cell stack; a word line separation layer vertically passing through the cell stack and extending lengthwise in a first direction parallel to a surface of the substrate; a contact plug vertically connected to the plurality of word lines on the extension region; and a bit line extending lengthwise in a second direction orthogonal to the first direction on the plurality of channel structures, wherein each of the plurality of word lines includes an inner pattern including polysilicon; and an outer pattern including metal, the outer pattern surrounds an outer surface of the inner pattern, the plurality of channel structures vertically pass through the inner pattern, and the contact plug is on the outer pattern The embodiments may be realized by providing a three-dimensional (3D) memory device including a substrate including a cell region and an extension region; a cell stack including a plurality of insulation layers and a plurality of word lines, alternately stacked on the substrate, and having a staircase structure on the extension region; a plurality of cell channel structures vertically passing through the cell stack on the cell region; and a plurality of dummy channel structures vertically passing through the cell stack on the extension region, wherein the plurality of word lines includes a plurality of inner patterns and a plurality of outer patterns surrounding outer surfaces of the plurality of inner patterns, the plurality of inner patterns on the cell region have an integrated plate shape, and the plurality of inner patterns on the extension region have a disk shape surrounding the plurality of cell channel structures.

The embodiments may be realized by providing a three-dimensional (3D) memory device including a substrate including a cell region and an extension region; a cell stack including a plurality of insulation layers and a plurality of word lines alternately stacked on the substrate; a plurality of channel structures on the cell region to vertically pass through the cell stack; a plurality of dummy channel structures on the extension region to vertically pass through the cell stack; a word line separation layer vertically passing through the cell stack and extending lengthwise in a first direction parallel to a surface of the substrate; a contact plug vertically connected to the plurality of word lines on the extension region; and a bit line extending lengthwise in a second direction orthogonal to the first direction on the plurality of channel structures, wherein each of the plurality of word lines includes a pad part arranged in a staircase structure on the extension region, the pad part includes a plurality of dummy inner patterns each surrounding a portion of a sidewall of a corresponding dummy channel structure of the plurality of dummy channel structures; and an outer pattern surrounding the plurality of dummy inner patterns, in a plan view, the plurality of dummy inner patterns are apart from one another in the first direction and the second direction, the outer pattern contacts the word line separation layer, and the contact plug contacts the outer pattern.

The embodiments may be realized by providing a method of manufacturing a three-dimensional (3D) memory device, the method including forming a mold stack on a substrate such that the mold stack includes a plurality of insulation layers and a plurality of sacrificial layers; forming a plurality of cell channel structures and a plurality of dummy channel structures vertically passing through the mold stack; forming a word line separation layer passing through the mold stack and extending lengthwise in a row direction; doping a portion of each of the plurality of sacrificial layers with impurities and removing another portion of each sacrificial layer to form a plurality of word lines between the plurality of insulation layers; forming a contact plug connected to the plurality of word lines; and forming a bit line on the plurality of cell channel structures, wherein forming the plurality of word lines includes forming a plurality of inner patterns surrounding the plurality of cell channel structures and the plurality of dummy channel structures; and forming a plurality of outer patterns surrounding the plurality of inner patterns and contacting the word line separation layer.

BRIEF DESCRIPTION OF THE DRAWINGS

Features will be apparent to those of skill in the art by describing in detail exemplary embodiments with reference to the attached drawings in which:

FIGS. 5A to 10B are cross-sectional views of stages in a method of manufacturing a 3D memory device 100 according to an embodiment of the disclosure.

DETAILED DESCRIPTION

Figure 1A:
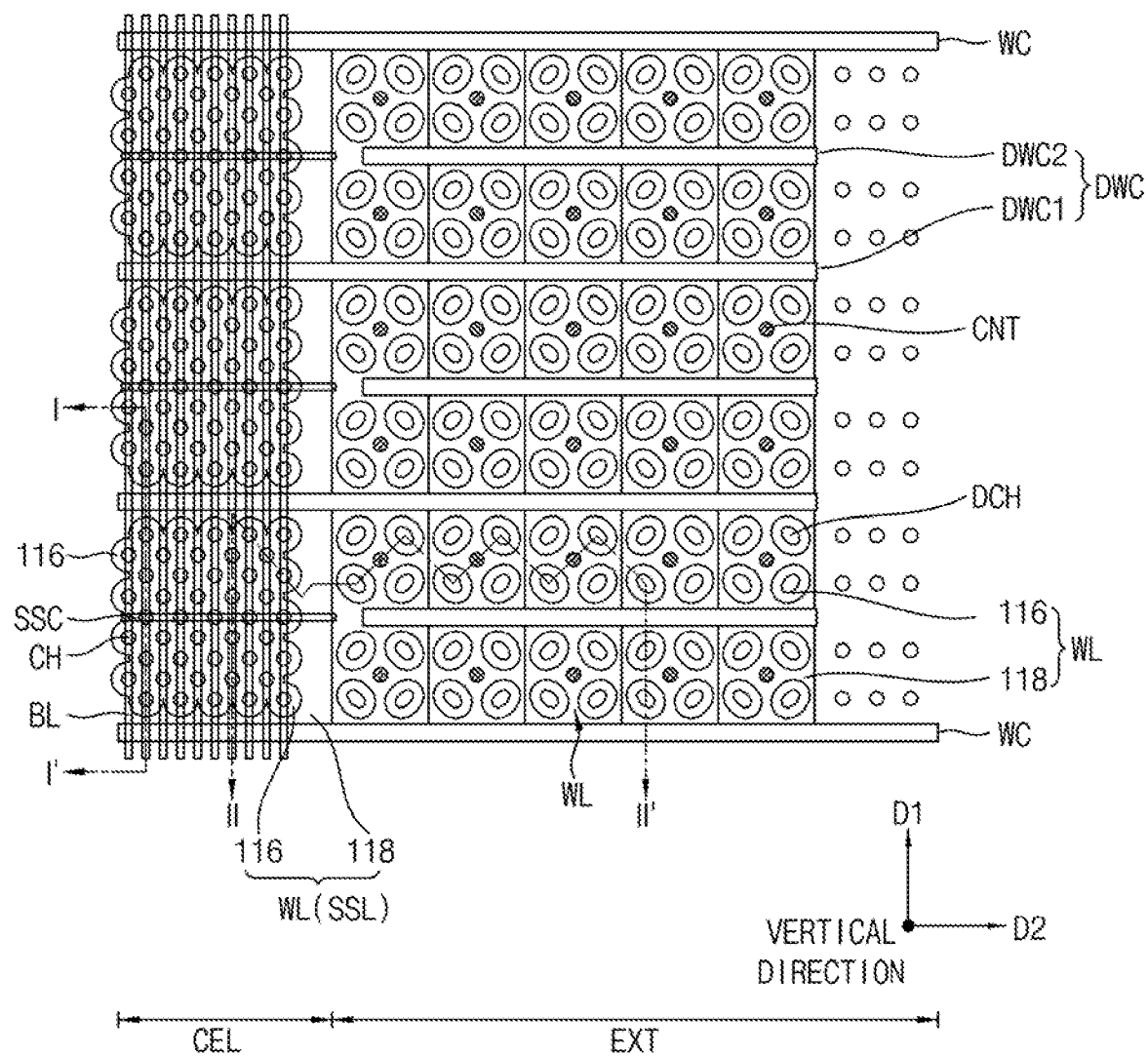
FIG. 1A is a schematic plan view of a 3D memory device 100 according to an embodiment of the disclosure.

FIG. 1A is a schematic plan view of a 3D memory device 100 according to an embodiment of the disclosure.

Referring FIG. 1A, the 3D memory device 100 according to an embodiment of the disclosure may include a cell region CEL where a plurality of memory cells are provided and an extension region EXT for connecting the memory cells to a wiring. As illustrated in FIG. 1A, only a portion of the cell region CEL is shown and the extension region EXT is at only one side of the cell region CEL. In an implementation, the extension region EXT may be at both sides of the cell region CEL.

The 3D memory device 100 may include a plurality of channel structures CH and DCH, a plurality of word lines WL, a plurality of word line separation layers WC, a plurality of dummy word line separation layers DWC, a plurality of string selection line separation patterns SSC, a plurality of contact plugs CNT, and a plurality of bit lines BL. The channel structures CH and DCH may include a plurality of cell channel structures CH and a plurality of dummy channel structures DCH.

The cell channel structures CH may be in the cell region CEL. The cell channel structures CH may be arranged in a first direction (a column direction) D1, and a pad row may be defined and a plurality of pad rows may be arranged in parallel in a second direction (a row direction) D2 (e.g., a direction orthogonal to the first direction D1). The cell channel structures CH may be arranged in a hexagonal close packing lattice form or a zigzag form.

The dummy channel structures DCH may be in the extension region EXT. The dummy channel structures DCH may have, e.g., a circular shape, an oval shape, an elbow shape, or a bar shape. The dummy channel structures DCH may be arranged in an orthorhombic lattice form. The dummy channel structures DCH may have a pattern density that is lower than that of each of the cell channel structures CH. The dummy channel structures DCH may surround the contact plugs CNT. In an implementation, each of the contact plugs CNT may be at a center between four dummy channel structures DCH adjacent thereto.

The word lines may extend (e.g., lengthwise) from the cell region CEL to the extension region EXT in the second direction D2, and lengths of the word lines WL in the second direction D2 may differ. The word lines WL may include a plurality of inner patterns 116 and a plurality of outer patterns 118. At least one of the word lines WL may be a string selection line SSL. The inner patterns 116 and the outer patterns 118 will be described below in detail with reference to FIG. 4.

The word line separation layers WC may extend (e.g., lengthwise) from the cell region CEL to the extension region EXT in the second direction D2. The dummy word line separation layers DWC may be spaced apart from the word line separation layers WC in parallel and may extend (e.g., lengthwise) in the second direction D2. The dummy word line separation layers DWC may be between a pair of word line separation layers WC. The dummy word line separation layers DWC may include a first dummy word line separation layer DWC1 extending from the cell region CEL to the extension region EXT and a second dummy word line separation layer DWC2 only in the extension region EXT. The first dummy word line separation layer DWC and the second dummy word line separation layer DWC may be alternately disposed between the pair of word line separation layers WC in the first direction D1. The word line separation layers WC may be spaced apart from the inner patterns 116 of the word lines WL and may contact outer surfaces of the outer patterns 118.

The string selection line separation pattern SSC may extend (e.g., lengthwise) in the second direction D2 in the cell region CEL to vertically overlap the word lines WL. The string selection line SSL may be physically and materially separated. The string selection line separation pattern SSC may be on a same line as the second dummy word line separation layer DWC in the second direction D2.

The contact plugs CNT may be arranged in a lattice form in the extension region EXT. Each of the contact plugs CNT may be at a center point of or between four dummy channel structures DCH adjacent thereto. The contact plugs CNT may be spaced apart from the inner patterns 116. The contact plugs CNT may be on the outer patterns 118.

The bit lines BL may extend (e.g., lengthwise) in the first direction D1 in the cell region CEL. The bit lines BL may be on the cell channel structures CH. The bit lines BL may extend along pad rows of the cell channel structures CH and may be spaced apart from one another in parallel in the second direction D2.

Figure 1B:
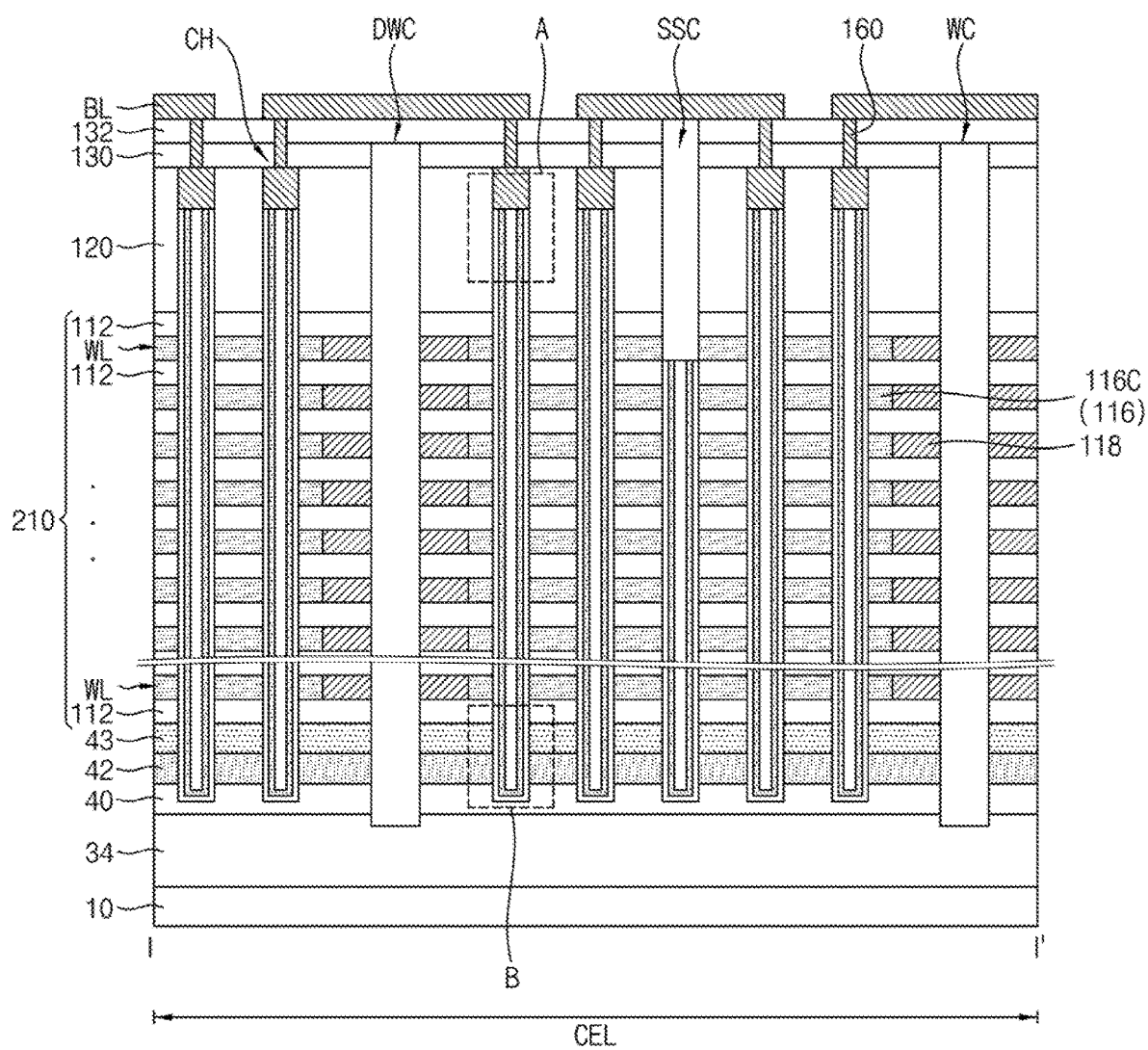
FIG. 1B is a cross-sectional view taken along line I-I' of the 3D memory device 100 according to an embodiment of the disclosure.
Figure 1C:
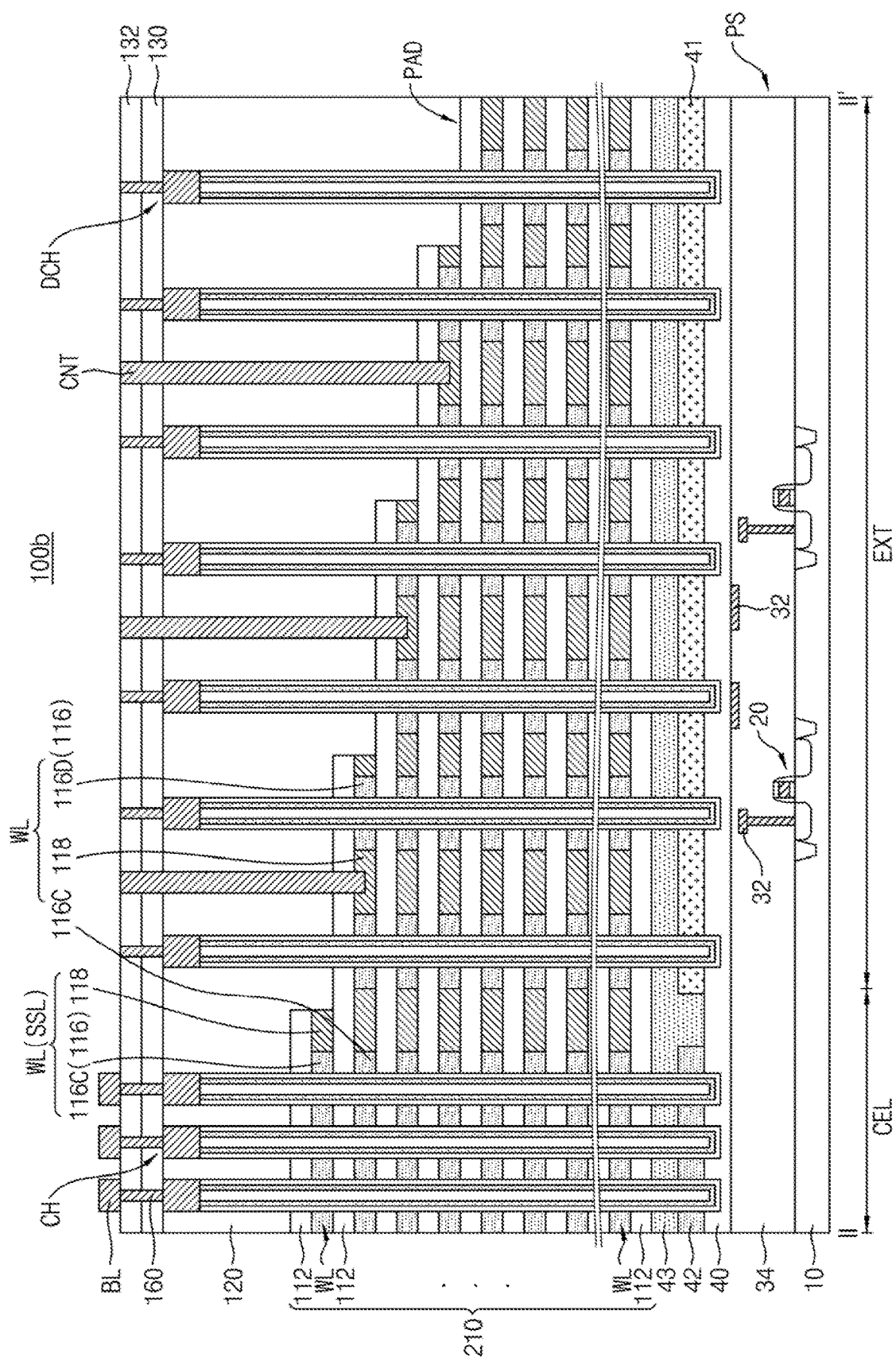
FIG. 1C is a cross-sectional view taken along line II-II' of the 3D memory device 100 according to an embodiment of the disclosure.

FIG. 1B is a cross-sectional view taken along line I-I' of the 3D memory device 100 according to an embodiment of the disclosure. FIG. 1C is a cross-sectional view taken along line II-II' of the 3D memory device 100 according to an embodiment of the disclosure.

Referring to FIGS. 1B and 1C, the 3D memory device 100 may include a substrate 10 (including the cell region CEL and the extension region EXT), a peripheral circuit layer PS, a common source layer 40, a conductive line 42, a supporting layer 43, a cell stack 210, an interlayer insulation layer 120, a cell channel structure CH, a dummy channel structure DCH, a plurality of word lines WL, a word line separation layer WC, a dummy word line separation layer DWC, a string selection line separation pattern SSC, a plurality of contact plugs CNT, a plurality of capping layers (e.g., a first capping layer and a second capping layer) 130 and 132, and a plurality of bit lines BL.

The substrate 10 may include a silicon wafer. In an implementation, the substrate 10 may include an epitaxial growth material layer such as a silicon layer, a silicon germanium layer, or a silicon carbide layer. In an implementation, the substrate 10 may include a silicon-on-insulator (SOI).

The peripheral circuit layer PS may be on the substrate 10. The peripheral circuit layer PS may include a transistor 20, a peripheral circuit wiring 32, and a peripheral insulation layer 34. The transistor 20 may include a source/drain region and a channel region each formed in an active region defined by an isolation layer. The peripheral circuit wiring 32 may be electrically connected to the transistor 20. The peripheral insulation layer 34 may cover the transistor 20 and the peripheral circuit wiring 32. The peripheral insulation layer 34 may include a plurality of insulation layers stacked as a multilayer. In an implementation, the peripheral insulation layer 34 may include, e.g., a silicon oxide layer, a silicon nitride layer, or a combination thereof. In an implementation, the peripheral circuit layer PS may be outside the extension region EXT. As used herein, the term "or" is not an exclusive term, e.g., "A or B" would include A, B, or A and B.

The common source layer 40 may be on the peripheral circuit layer PS. The common source layer 40 may include a semiconductor material, e.g., may include silicon, germanium, silicon germanium, gallium arsenic, indium gallium arsenic, aluminum gallium arsenic, or a combination thereof. The common source layer 40 may include a semiconductor with P-type impurities doped thereon or an undoped intrinsic semiconductor. In a top or plan view, the common source layer 40 may have a plate shape or a line shape.

A sacrificial pattern 41 may be on the common source layer 40 on the extension region EXT. The sacrificial pattern 41 may include a plurality of insulation layers stacked as a multilayer.

The conductive line 42 may be on the common source layer 40 on the cell region CEL. The conductive line 42 may be at a same level (e.g., a same distance from the substrate 10 in a vertical direction orthogonal to the first direction D1 and the second direction D2) as the sacrificial pattern 41. An opening, which is adjacent to or spaced apart from the sacrificial pattern 41 and exposes a portion of a top surface of the common source layer 40, may be in the conductive line 42.

The supporting layer 43 may be on the sacrificial pattern 41 and the conductive line 42. The supporting layer 43 may extend to an inner portion of the opening between the conductive line 42 and the sacrificial pattern 41 and may cover the top surface of the common source layer 40.

The cell stack 210 may be on the supporting layer 43. The cell stack 210 may include an insulation layer 112 and a word line WL, which are alternately and repeatedly stacked.

The cell stack 210 may have a staircase structure on the extension region EXT. Pairs of insulation layer 112 and the word line WL may extend different lengths in the second direction D2 to provide a plurality of pad parts PAD having a step (e.g., height difference in the vertical direction) therebetween. The pad parts PAD may have a staircase structure on the extension region EXT. The pad parts PAD may be connected to the contact plugs CNT.

At least one of the word lines WL may be a ground selection line GSL, and at least one thereof may be a string selection line SSL. In an implementation, a lowermost word line WL (e.g., closest to the substrate 10 in the vertical direction among the word lines WL) may be the ground selection line GSL. An uppermost word line WL (e.g., farthest away from the substrate 10 in the vertical direction among the word lines WL) may be the string selection line SSL.

In an implementation, the word line WL may include an inner pattern 116 and an outer pattern 118. The inner pattern 116 and the insulation layer 112 may be alternately and repeatedly stacked on the substrate 10. The outer pattern 118 and the insulation layer 112 may be alternately and repeatedly stacked on the substrate 10. The inner pattern 116 and the outer pattern 118 may be at the same level, and a side surface of the inner pattern 116 may contact (e.g., directly contact) a side surface of the outer pattern 118. The inner pattern 116 and the outer pattern 118 each at the same level may have the same thickness. In an implementation, the inner pattern 116 may include, e.g., polysilicon with P-type impurities doped thereon. The outer pattern 118 may include a metal material, e.g., tungsten (W).

The inner pattern 116 may include a cell inner pattern 116C on the cell region CEL and a dummy inner pattern 116D on the extension region EXT.

The cell inner pattern 116C may be between the cell channel structures CH on the cell region CEL. The cell inner pattern 116C may contact a portion of a side surface of each of the cell channel structures CH. The cell inner pattern 116C may be spaced apart from the word line separation layer WC and the dummy word line separation layer DWC. In a cross-sectional view, an outer portion of the cell inner pattern 116C may be between the cell channel structures CH and the outer pattern 118.

The dummy inner patterns 116D may be adjacent to the cell channel structures CH on the extension region EXT. The dummy inner patterns 116D may be spaced apart from one another in the first direction D1 and/or second direction D2, and the vertical direction. An inner surface of each of the dummy inner patterns 116D may surround a portion of a sidewall of a corresponding dummy channel structure DCH of the dummy channel structures DCH. Each of the dummy inner patterns 116D may be surrounded by the outer pattern 118, and an outer surface thereof may contact a side surface of the outer pattern 118.

The outer pattern 118 may extend from the cell region CEL to the extension region EXT in the second direction D2. A portion of the outer pattern 118 may be between the word line separation layer WC and the inner pattern 116 on the cell region CEL. An outer surface of the outer pattern 118 may contact an outer surface of the inner pattern 116, and an inner surface of the outer pattern 118 may contact a portion of a sidewall of the word line separation layer WC. The outer pattern 118 may be between the inner patterns 116 on the extension region EXT. An outer surface of the outer pattern 118 on the extension region EXT may contact the interlayer insulation layer 120.

The interlayer insulation layer 120 may cover a top surface of a mold stack 110. The interlayer insulation layer 120 may cover a staircase structure of the mold stack. In an implementation, the interlayer insulation layer 120 include silicon oxide.

The cell channel structures CH may pass through the conductive line 42, the supporting layer 43, and the mold stack 110, and may extend lengthwise in the vertical direction on the cell region CEL. The cell channel structures CH may be electrically connected to the conductive line 42.

The dummy channel structures DCH may pass through the sacrificial pattern 41, the supporting layer 43, the mold stack 110, and the interlayer insulation layer 120 and may extend lengthwise in the vertical direction on the extension region EXT.

The first capping layer 130 and the second capping layer 132 may be sequentially stacked on the interlayer insulation layer 120. The bit line plug 160 may pass through the first capping layer 130 and the second capping layer 132 and may be connected to a conductive pad 153. The bit line BL may be on the second capping layer 132 and may be electrically connected to the bit line plug 160.

The word line separation layer WC and the dummy word line separation layer DWC may pass through the conductive line 42, the sacrificial pattern 41, the supporting layer 43, the mold stack 110, the interlayer insulation layer 120, and the first capping layer 130, and may extend lengthwise in the vertical direction. An outer sidewall of each of the word line separation layer WC and the dummy word line separation layer DWC may contact the outer pattern 118.

The string selection line separation pattern SSC may be on the mold stack 110 on the cell region CEL. The string selection line separation pattern SSC may extend downwardly in the vertical direction from a top surface of the mold stack 110 to vertically pass through the insulation layer 112 and the word line WL. In an implementation, the string selection line separation pattern SSC may separate the mold stack 110 from the string selection line SSL at an uppermost level.

The contact plugs CNT may be on the extension region EXT. The contact plugs CNT may vertically pass through the capping layers 130 and 132 and the interlayer insulation layer 120 and may be vertically connected to the word lines WL. The contact plugs CNT may pass through the insulation layer 112 contacting the interlayer insulation layer 120 and may be vertically connected to the outer pattern 118 of the word line WL. The contact plugs CNT may be connected to the outer pattern 118 constituting the pad part PAD among the word lines WL.

The capping layers 130 and 132 may be on the interlayer insulation layer 120. The bit lines BL may be on the interlayer insulation layer 120. The bit line plug 160 may pass through the capping layers 130 and 132 and may be connected to the bit line BL and the cell channel structure CH.

Figure 2:
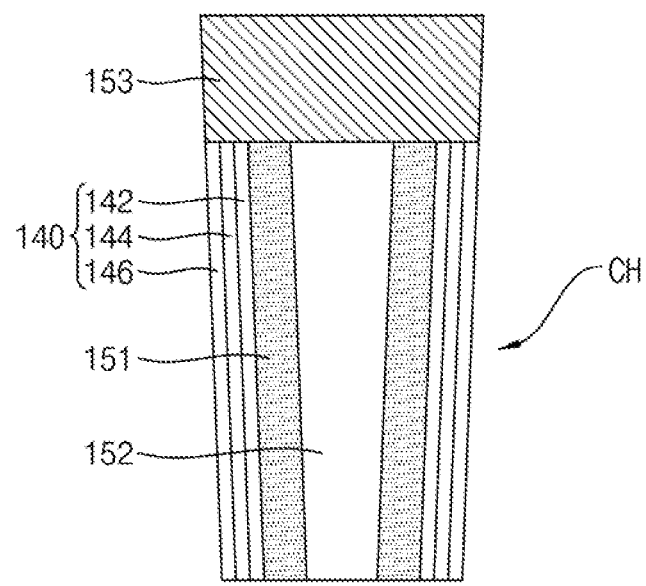
FIG. 2 is an enlarged view of a region A of the 3D memory device 100a illustrated in FIG. 1B.
Figure 3:
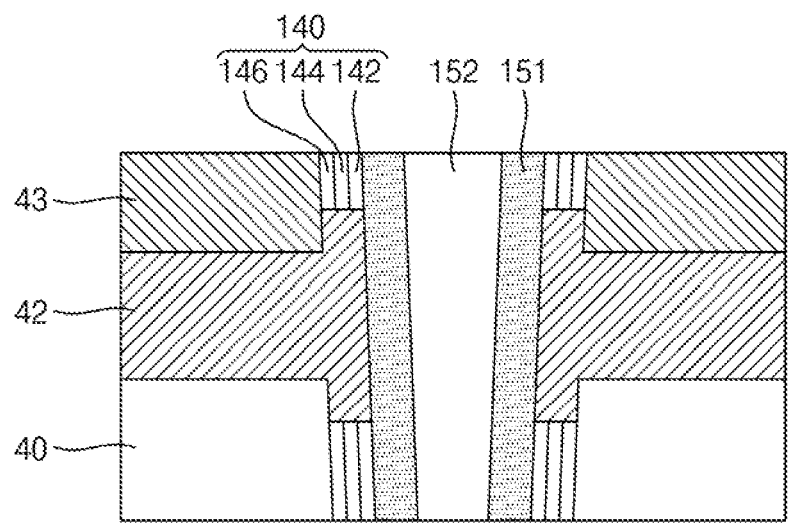
FIG. 3 is an enlarged view of a region B of the 3D memory device 100a illustrated in FIG. 1B.

FIG. 2 is an enlarged view of a region A of the 3D memory device 100a illustrated in FIG. 1B. FIG. 3 is an enlarged view of a region B of the 3D memory device 100a illustrated in FIG. 1B.

Referring to FIG. 2, the cell channel structure CH may include an information storage pattern 140, a channel pattern 151, a buried insulation pattern 152, and a conductive pad 153. The channel pattern 151 may be disposed inward relative to the information storage pattern 140, and the buried insulation pattern 152 may be disposed inward relative to the channel pattern 151. The information storage pattern 140 may configure channel structures CH and DCH and may contact an inner pattern 116 of a word line WL. The information storage pattern 140 may include a blocking layer 142, a charge storage layer 144, and a tunnel insulation layer 146. The blocking layer 142 may be disposed inward relative to the charge storage layer 144, and charge storage layer 144 may be disposed inward relative to the tunnel insulation layer 146. In an implementation, the channel pattern 151 may include polysilicon. The buried insulation pattern 152 may include silicon oxide, silicon nitride, silicon oxynitride, or a combination thereof. In an implementation, the blocking layer 142 and the tunnel insulation layer 146 may include silicon oxide, and the charge storage layer 144 may include silicon nitride. The dummy channel structure DCH may have substantially the same structure as that of the cell channel structure CH. In an implementation, the dummy channel structure DCH may include the information storage pattern 140, the channel pattern 151, and the buried insulation pattern 152.

Referring to FIG. 3, the conductive line 42 may pass through the information storage pattern 140 and may directly contact a side surface of the channel pattern 151. A portion of the conductive line 42 contacting the channel pattern 151 may extend in an upward direction and a downward direction.

Figure 4:
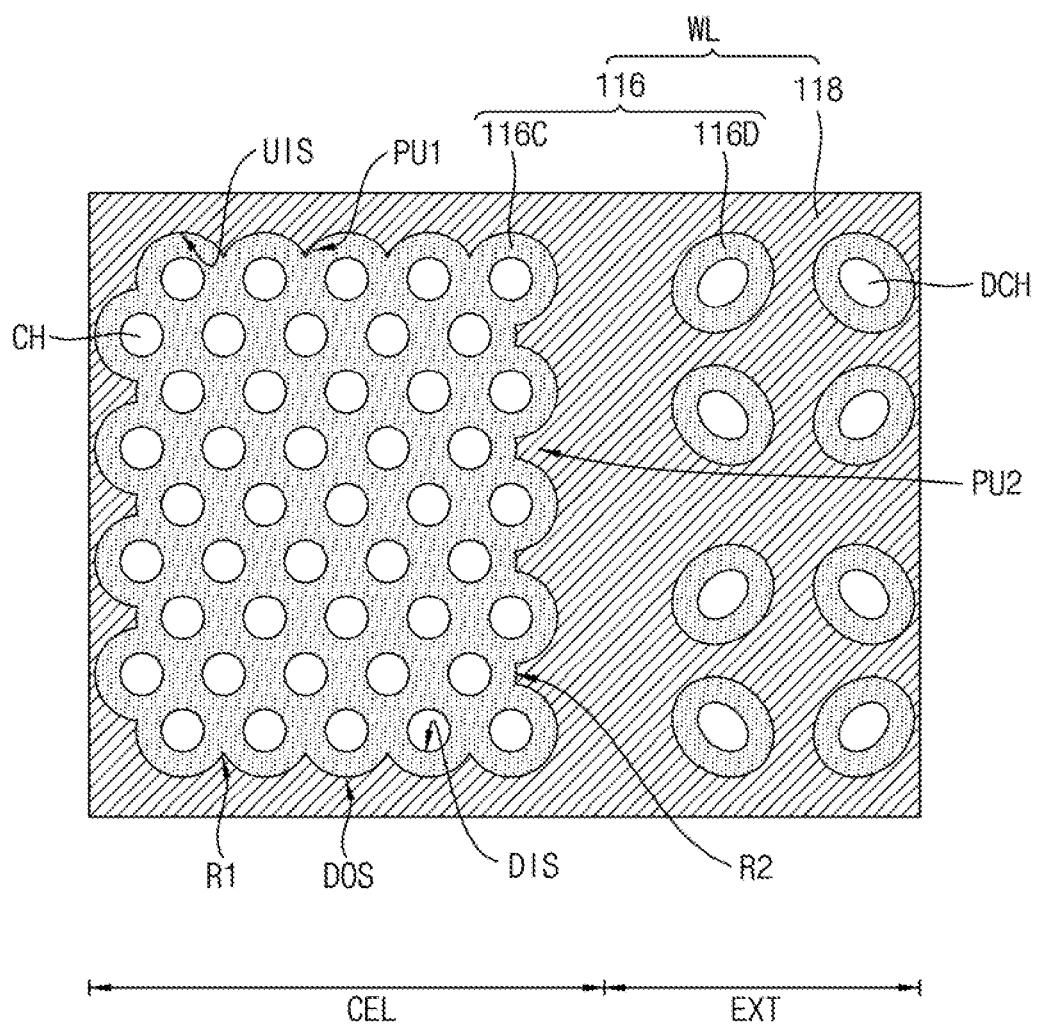
FIG. 4 is a plan view of a word line WL of a 3D memory device 100 according to an embodiment of the disclosure.

FIG. 4 is a plan view of a word line WL of a 3D memory device 100 according to an embodiment of the disclosure.

Referring to FIGS. 1A, 1B, 1C, and 4, the word line WL may include the inner pattern 116 and the outer pattern 118 surrounding an outer surface of the inner pattern 116. The inner pattern 116 may include the cell inner pattern 116C on the cell region CEL and the dummy inner pattern 116D on the extension region EXT.

The cell inner pattern 116C may surround cell channel structures CH and may fully fill a region between cell channel structures CH adjacent to each other. The cell inner pattern 116C may include a plurality of inner surfaces DIS having a circular or rounded shape, and the inner surfaces DIS may respectively surround side surfaces of the cell channel structures CH. In an implementation, the cell inner pattern 116C may have a plate pattern shape that includes a corresponding hole provided in each of regions with the cell channel structures CH formed therein. The cell inner pattern 116C may have a plate shape integrated with a ring or disk shape. The cell inner pattern 116C may include an outer surface DOS having an uneven shape. In an implementation, in a top or plan view, the outer surface DOS of the cell inner pattern 116C may have an embossing shape, a wave shape, or a shape where a plurality of arcs are connected to one another. In an implementation, the outer surface DOS of the cell inner pattern 116C may include a plurality of recesses R1 and R2 that are recessed in an inward direction of the cell inner pattern 116C.

The dummy inner patterns 116D may be on the extension region EXT and may be arranged in a lattice form. Each of the dummy inner patterns 116D may have a circular or oval ring shape or a circular or oval disk shape. In an implementation, each of the dummy inner patterns 116D may include a circular or oval hole at a center thereof. The dummy channel structure DCH may be in the hole, and the dummy inner patterns 116D may surround outer surfaces of the dummy channel structures DCH. Each of the dummy inner patterns 116D may have a substantially uniform thickness (e.g., in the vertical direction).

The outer pattern 118 may be outside the cell inner pattern 116C. The outer pattern 118 may surround the cell inner pattern 116C. The outer pattern 118 may contact the cell inner pattern 116C. The outer pattern 118 may include an inner surface UIS having an uneven shape along (e.g., complementary to) the outer surface DOS of the cell inner pattern 116C. In an implementation, in a top or plan view, the inner surface UIS of the outer pattern 118 may have an embossing shape, a wave shape, or a shape where a plurality of arcs are connected to one another. In an implementation, the outer pattern 118 may include a plurality of protrusions PU1 and PU2 protruding toward the cell inner pattern 116C (e.g., corresponding or complementary to the recesses R1 and R2 of the cell inner pattern 116C).

FIGS. 5A to 10B are cross-sectional views of stages in a method of manufacturing a 3D memory device 100 according to an embodiment of the disclosure.

Figure 5A:
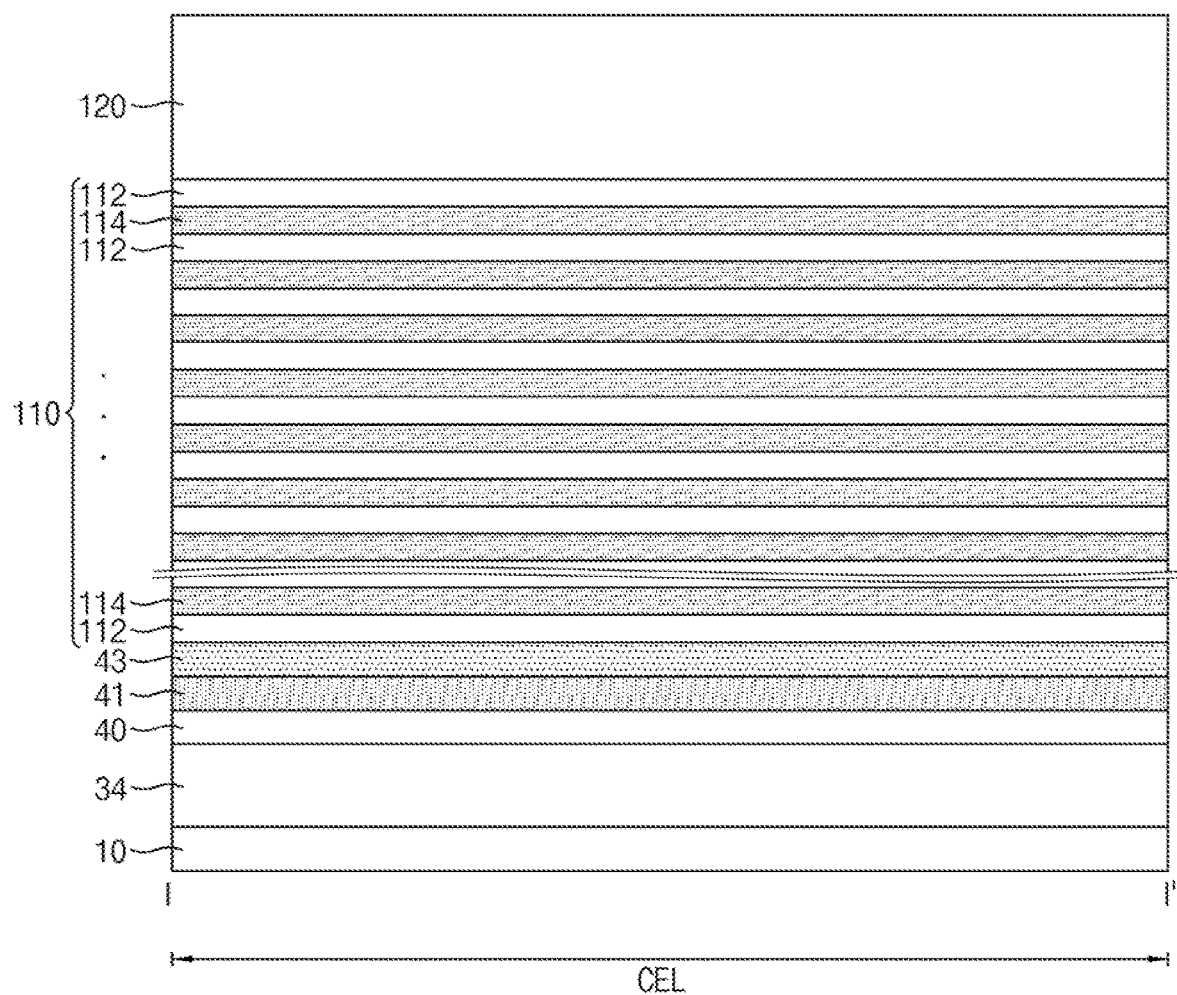

Referring to FIGS. 5A and 5B, a method of manufacturing a semiconductor device according to an embodiment of the disclosure may include forming a peripheral circuit layer PS on a substrate 10, forming a common source layer 40 on the peripheral circuit layer PS, forming a sacrificial pattern 41 on the common source layer 40, forming a supporting layer 43 on the sacrificial pattern 41, forming a mold stack 110 on the supporting layer 43, and forming an interlayer insulation layer 120 on the mold stack 110.

Forming the sacrificial pattern 41 on the common source layer 40 may include forming a sacrificial film on the common source layer 40, forming a mask pattern on the sacrificial film, and exposing a portion of a top surface of the common source layer 40 by etching the sacrificial film by using the mask pattern as an etch mask. The sacrificial pattern 41 may include, e.g., silicon nitride, silicon oxynitride, silicon carbide, or silicon germanium. The sacrificial pattern 41 may be formed, and the mask pattern may be removed.

The supporting layer 43 may be formed to cover the sacrificial pattern 41 and the exposed top surface of the common source layer 40 and to fill an opening. In an implementation, the supporting layer 43 may include impurity-doped polysilicon.

Forming the mold stack 110 may include forming a mold structure by alternately stacking an insulation layer 112 and a sacrificial layer 114 on a substrate 10 and performing a trimming process on the mold structure. The insulation layer 112 and the sacrificial layer 114 may independently include materials capable of being etched with different etch selectivity. In an implementation, the insulation layer 112 may include silicon oxide, and the sacrificial layer 114 may include silicon nitride.

The trimming process may include repeating a process of forming a mask pattern on the mold structure to etch a portion of the mold structure and decreasing a horizontal area of the mask pattern. Through the trimming process, the mold stack may be formed to have a staircase structure where a height is incrementally reduced in a direction from a cell region CEL to an extension region EXT.

The interlayer insulation layer 120 may be formed on the substrate 10 to cover the mold stack 110. The interlayer insulation layer 120 may include a material having an etch selectivity with respect to the sacrificial layer 114. In an implementation, the interlayer insulation layer 120 may include, e.g., silicon oxide, silicon oxynitride, low-k dielectrics, high-k dielectrics, or a combination thereof.

Figure 6A:
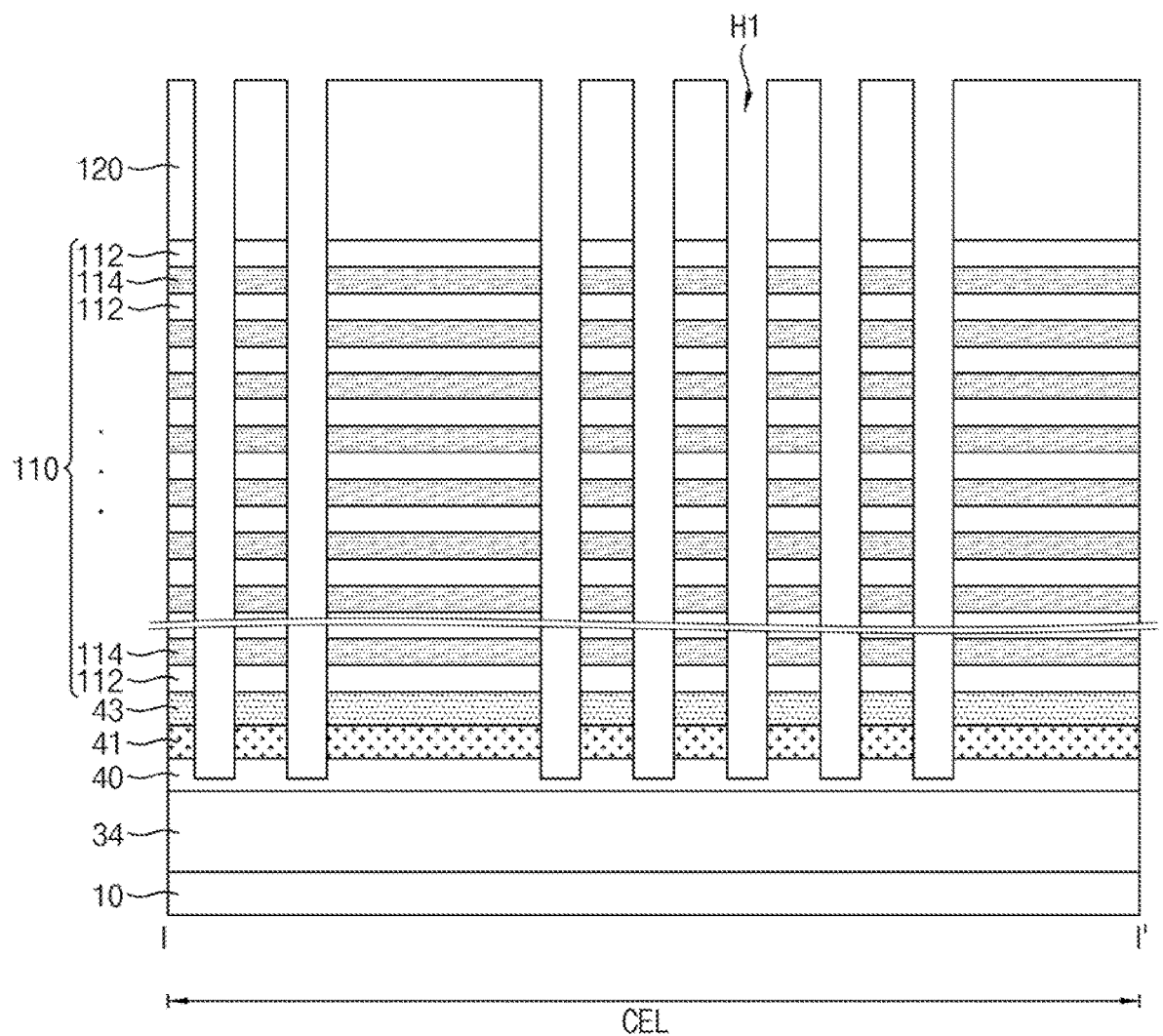
Figure 6B:
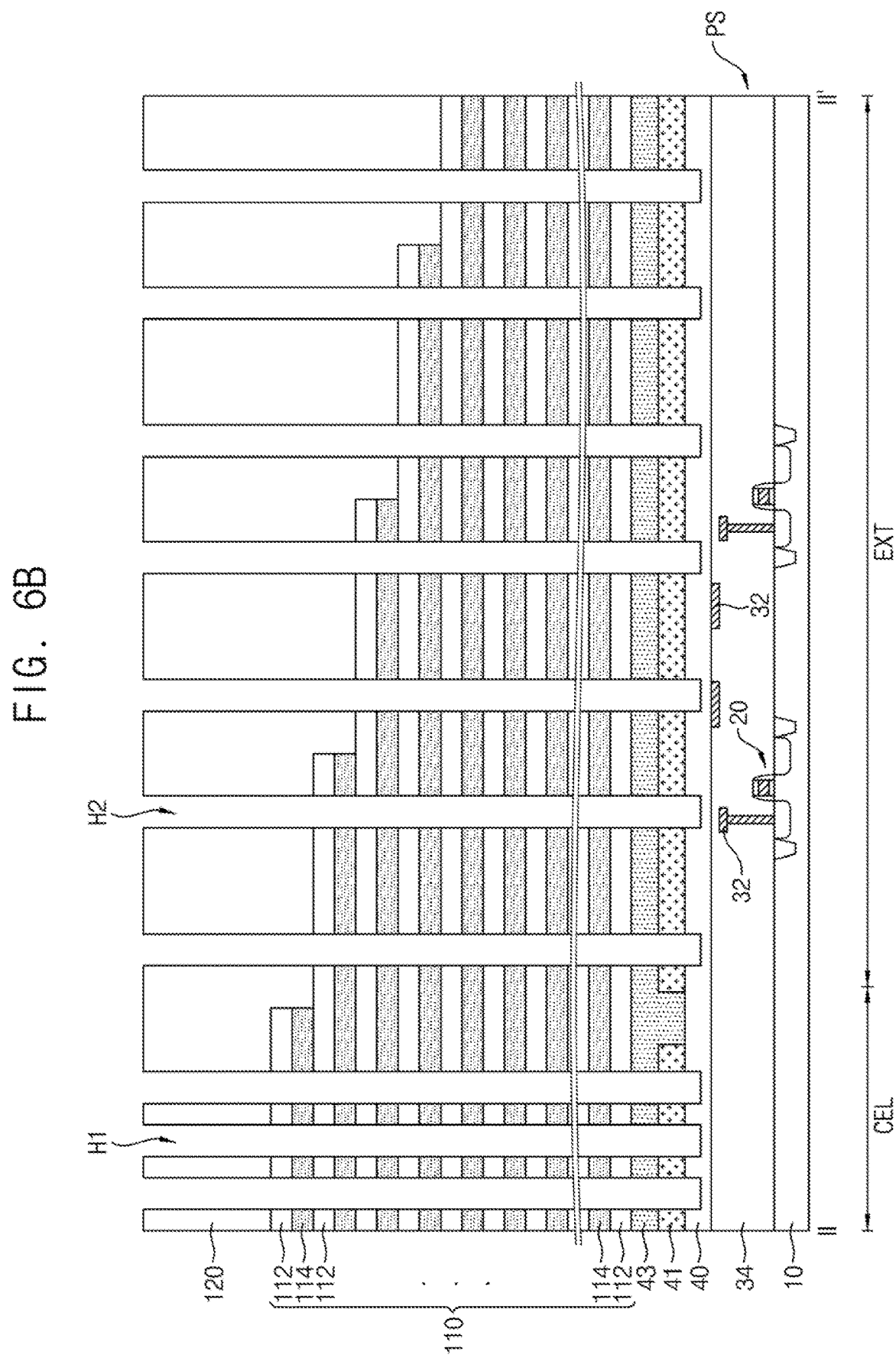

Referring to FIGS. 6A and 6B, the method may include forming a channel hole H1 and a dummy channel hole H2, which pass through the mold stack 110, the interlayer insulation layer 120, the supporting layer 43, and the sacrificial pattern 41. Forming the channel hole H1 and the dummy channel hole H2 may include forming a mask pattern on the interlayer insulation layer 120 and anisotropic-etching the mold stack 110, the interlayer insulation layer 120, the supporting layer 43, and the sacrificial pattern 41 by using the mask pattern as an etch mask. Through the anisotropic-etching, a portion of the common source layer 40 may be etched, and thus, a recess may be formed in the substrate 10. The channel hole H1 may be formed in the cell region CEL, and the dummy channel hole H2 may be formed in the extension region EXT. The channel hole H1 and the dummy channel hole H2 may expose inner sidewalls of the mold stack 110, the interlayer insulation layer 120, the supporting layer 43, and the sacrificial pattern 41 and may expose a portion of a surface of the substrate 10.

Figure 7A:
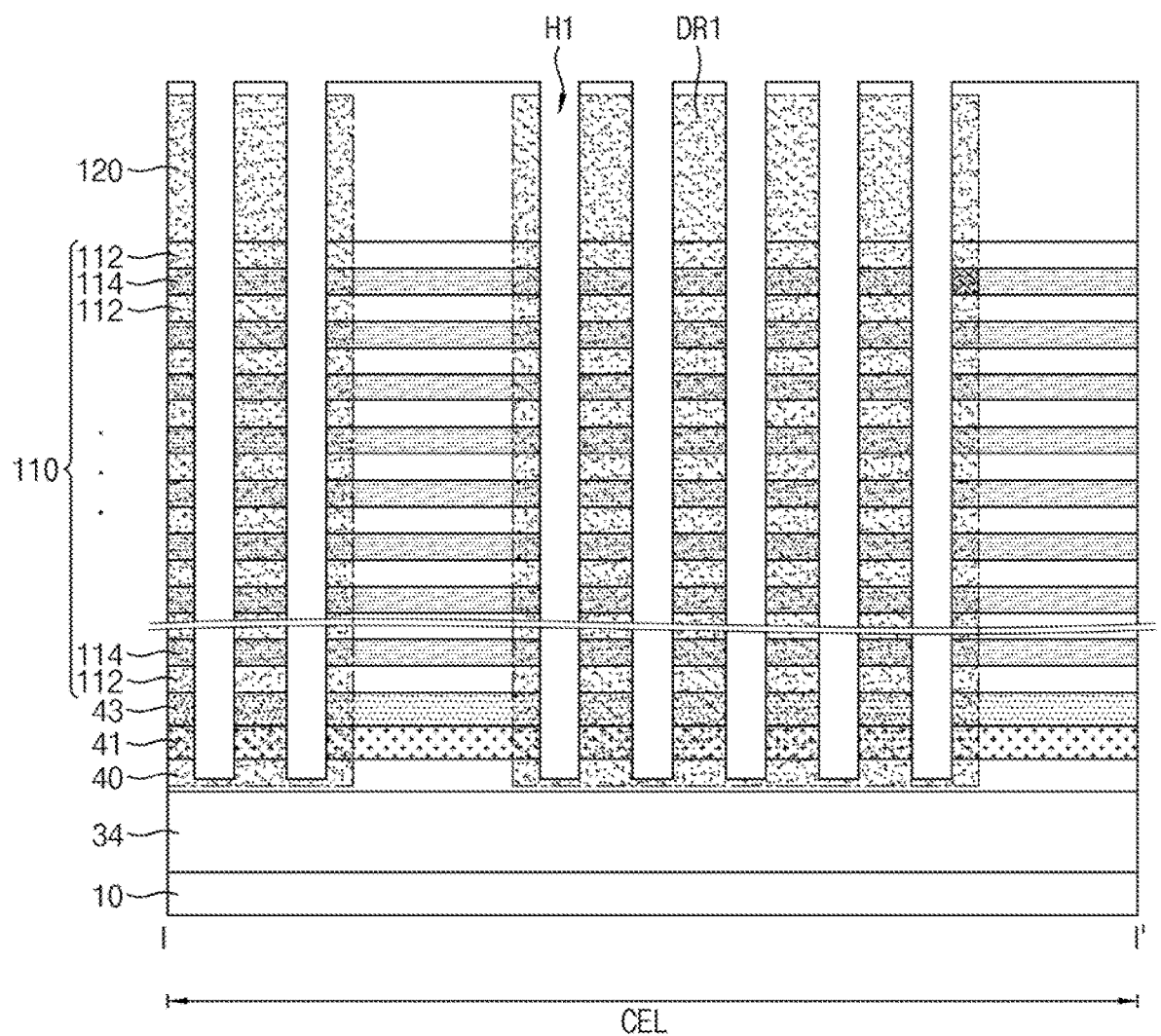
Figure 7B:
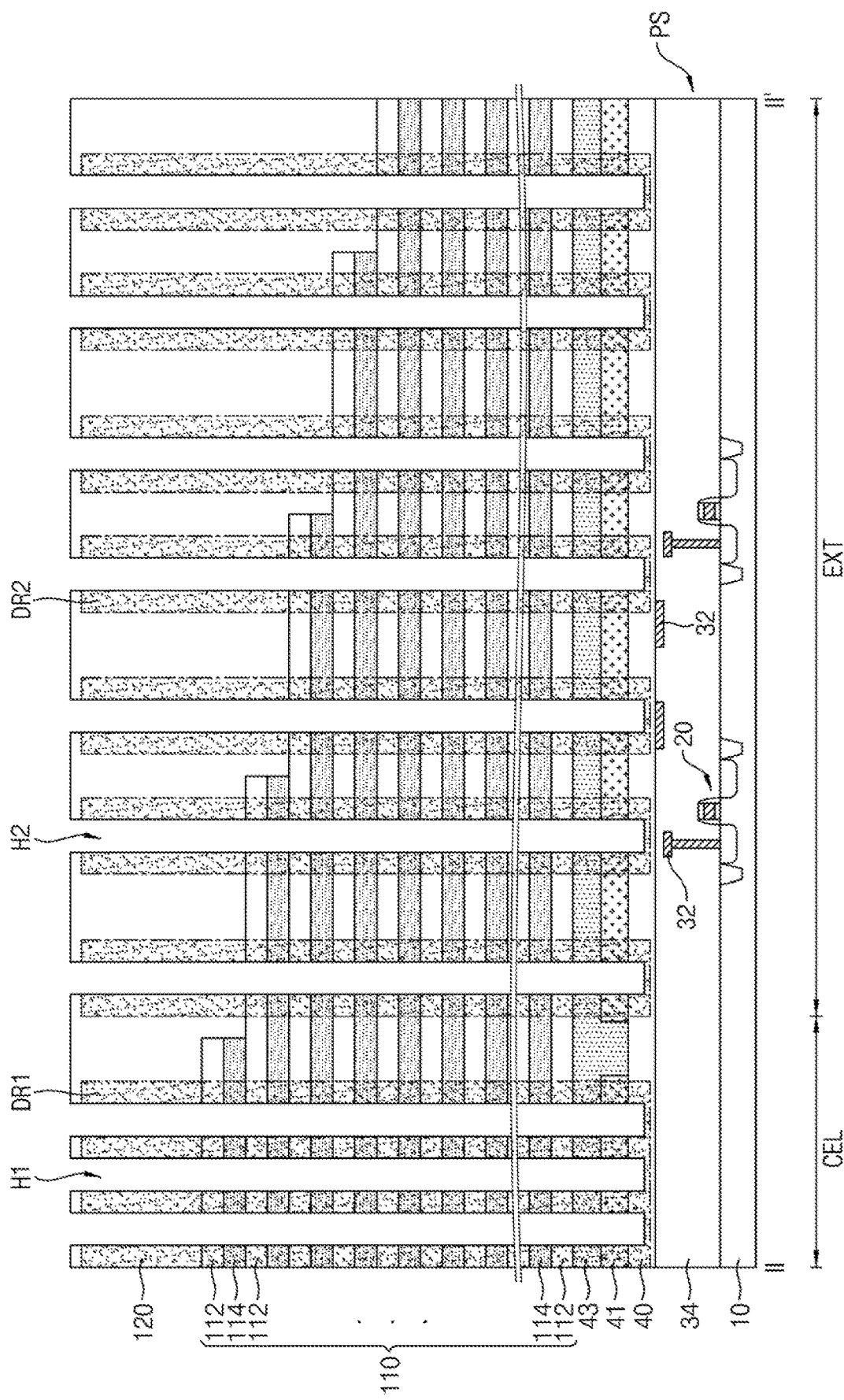

Referring to FIGS. 7A and 7B, the method may include forming a plurality of doped regions DR1 and DR2 by doping the mold stack 110 with impurities. In an implementation, Forming the doped regions DR1 and DR2 may include performing a gas phase doping (GPD) process using a source gas including impurities. The source gas used for the GPD process may include P-type impurities. In an implementation, the source gas may include impurities such as boron (B) and carbon (C). In an implementation, forming the impurity region may include performing a plasma doping process.

Through the GPD process, the source gas including the P-type impurities may be provided to inner portions of the channel hole H1 and the dummy channel hole H2. The source gas including the P-type impurities may be provided to, at a certain flux, whole inner sidewall surfaces of the interlayer insulation layer 120, the mold stack 110, the supporting layer 43, and the sacrificial pattern 41 each exposed through the channel hole H1 and the dummy channel hole H2, and thus, may be diffused from a surface to an inner portion of each of the interlayer insulation layer 120, the mold stack 110, the supporting layer 43, and the sacrificial pattern 41. Also, the P-type impurities may be diffused from a surface to an inner portion of the common source layer 40. In an implementation, the P-type impurities may be diffused to each of the interlayer insulation layer 120, the mold stack 110, the supporting layer 43, and the sacrificial pattern 41 with a uniform horizontal thickness (e.g., may diffuse to a uniform depth). The doped regions DR1 and DR2 may have a uniform thickness outside or around the channel hole H1 and the dummy channel hole H2. Through the GPD process, a region between channel holes H1 adjacent to each other on the cell region CEL may be fully doped with the P-type impurities.

Figure 8A:
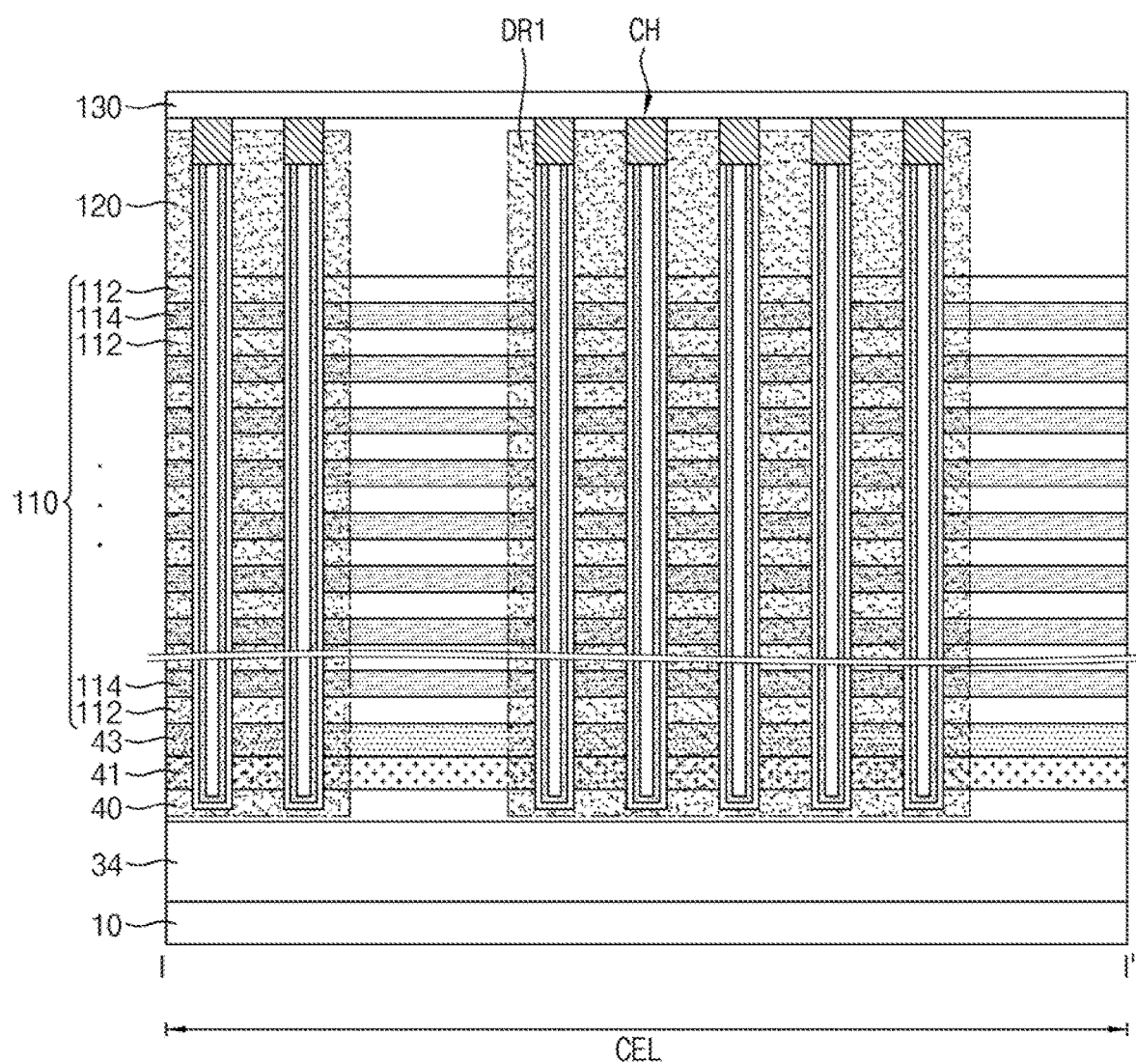
Figure 8B:
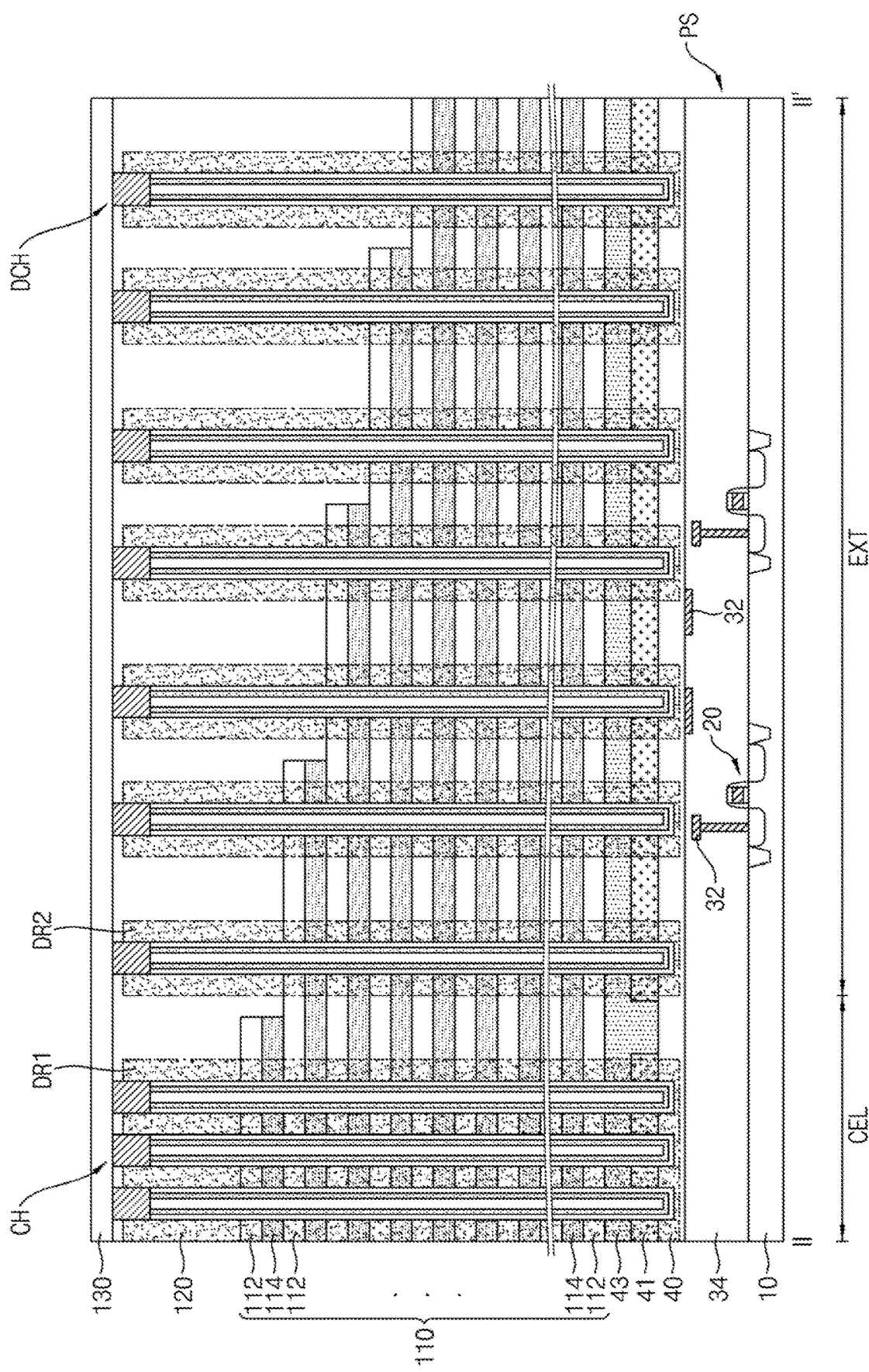

Referring to FIGS. 8A and 8B, the method may include forming a cell channel structure CH and a dummy channel structure DCH and forming a first capping layer 130. Forming the cell channel structure CH and the dummy channel structure DCH may include sequentially forming an information storage pattern 140, a channel pattern 151, a buried insulation pattern 152, and a conductive pad 153 in the channel hole H1 and the dummy channel hole H2.

The information storage pattern 140 and the channel pattern 151 may be formed to fill a portion of each of the channel hole H1 and the dummy channel hole H2. The buried insulation pattern 152 may fill a residual space remaining after the information storage pattern 140 and the buried insulation pattern 152 are formed, in the channel hole H1 and the dummy channel hole H2. The conductive pad 153 may be formed on the information storage pattern 140, the channel pattern 151, and the buried insulation pattern 152. After the cell channel structure CH and the dummy channel structure DCH, the first capping layer 130 may be formed on the conductive pad 153 and the interlayer insulation layer 120.

Figure 9A:
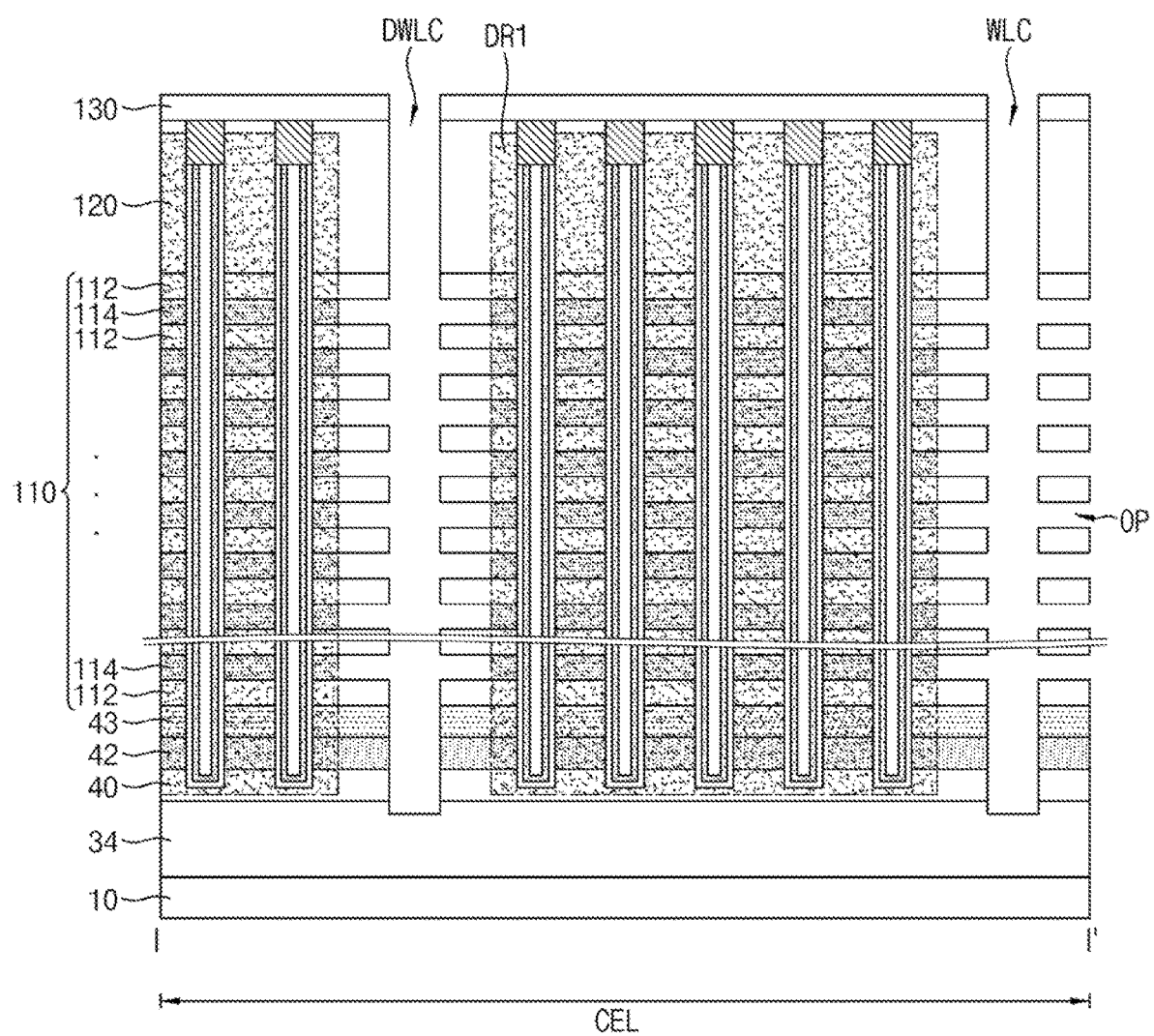
Figure 9B:
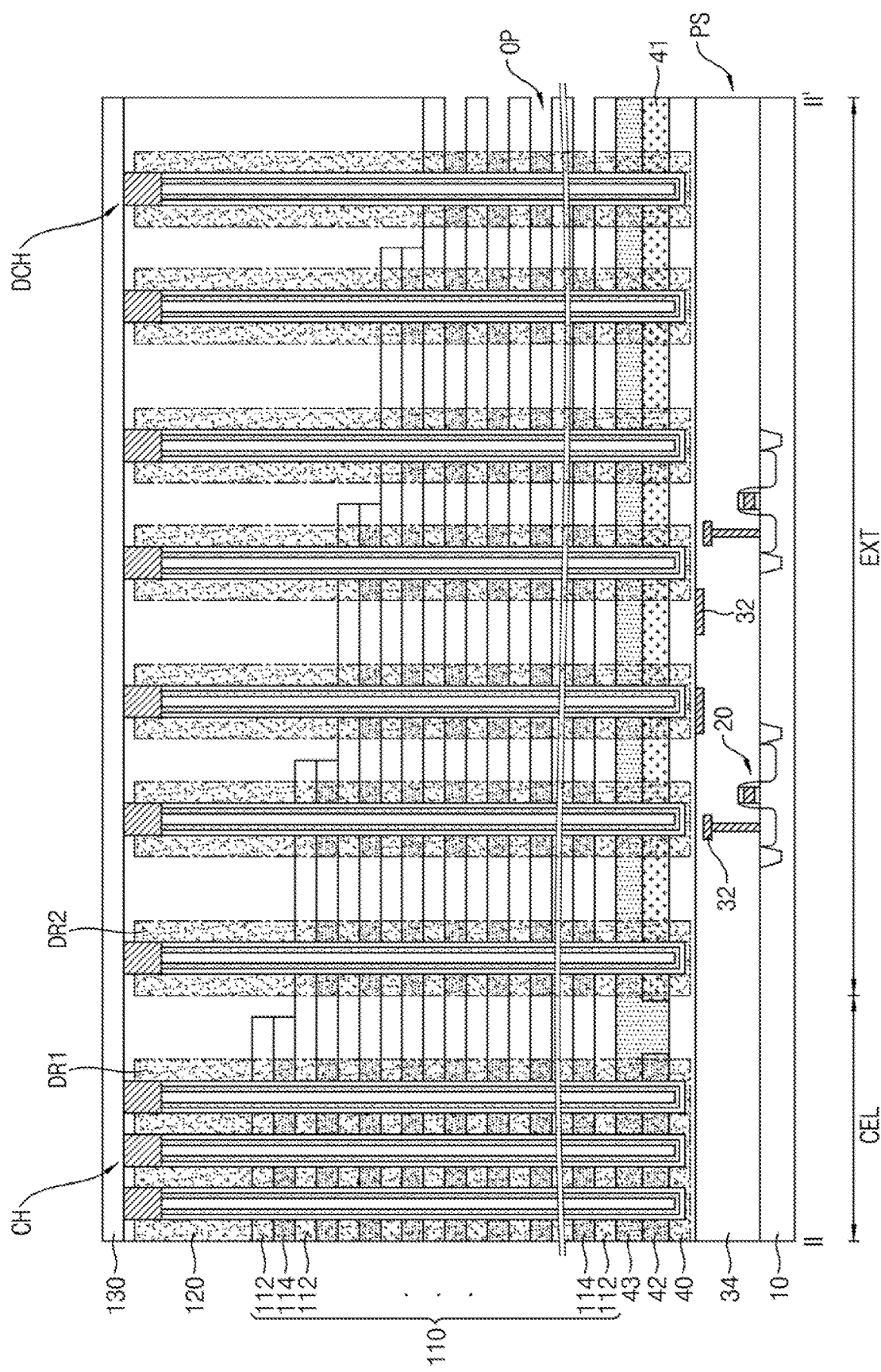

Referring to FIGS. 9A and 9B, the method may include forming a word line cut WLC and a dummy word line cut DWLC, forming a conductive line 42 by removing a portion of the sacrificial pattern 41, and forming an open region OP by removing the sacrificial layer 114.

The word line cut WLC and the dummy word line cut DWLC may be formed to pass through the first capping layer 130, the interlayer insulation layer 120, the supporting layer 43, the sacrificial pattern 41, and the common source layer 40. Forming the word line cut WLC and the dummy word line cut DWLC may include performing an anisotropic etching process.

Forming the conductive line 42 may include selectively removing the sacrificial pattern 41 exposed by the word line cut WLC and the dummy word line cut DWLC by using an isotropic etching process. Through the isotropic etching process, the portion of the sacrificial pattern 41 on the cell region CEL may be removed, and a top surface of the common source layer 40, a bottom surface of the supporting layer 43, and a portion of a side surface of the cell channel structure CH may be exposed or removed. Subsequently, the conductive line 42 may be formed in a space from which the sacrificial pattern 41 is removed. In an implementation, the conductive line 42 may include, e.g., metal, metal nitride, metal oxide, metal silicide, polysilicon, conductive carbon, or a combination thereof.

The sacrificial layer 114, e.g., in an undoped region which is the other region other than a doped region with impurities doped thereon, may be removed therefrom, and thus, the open region OP may be formed. In an implementation, a portion, which is not doped with P-type impurities, of the sacrificial layer 114 may be selectively removed. A portion, doped with P-type impurities, of the sacrificial layer 114 may remain, and thus, the inner pattern 116 may be formed.

Figure 10A:
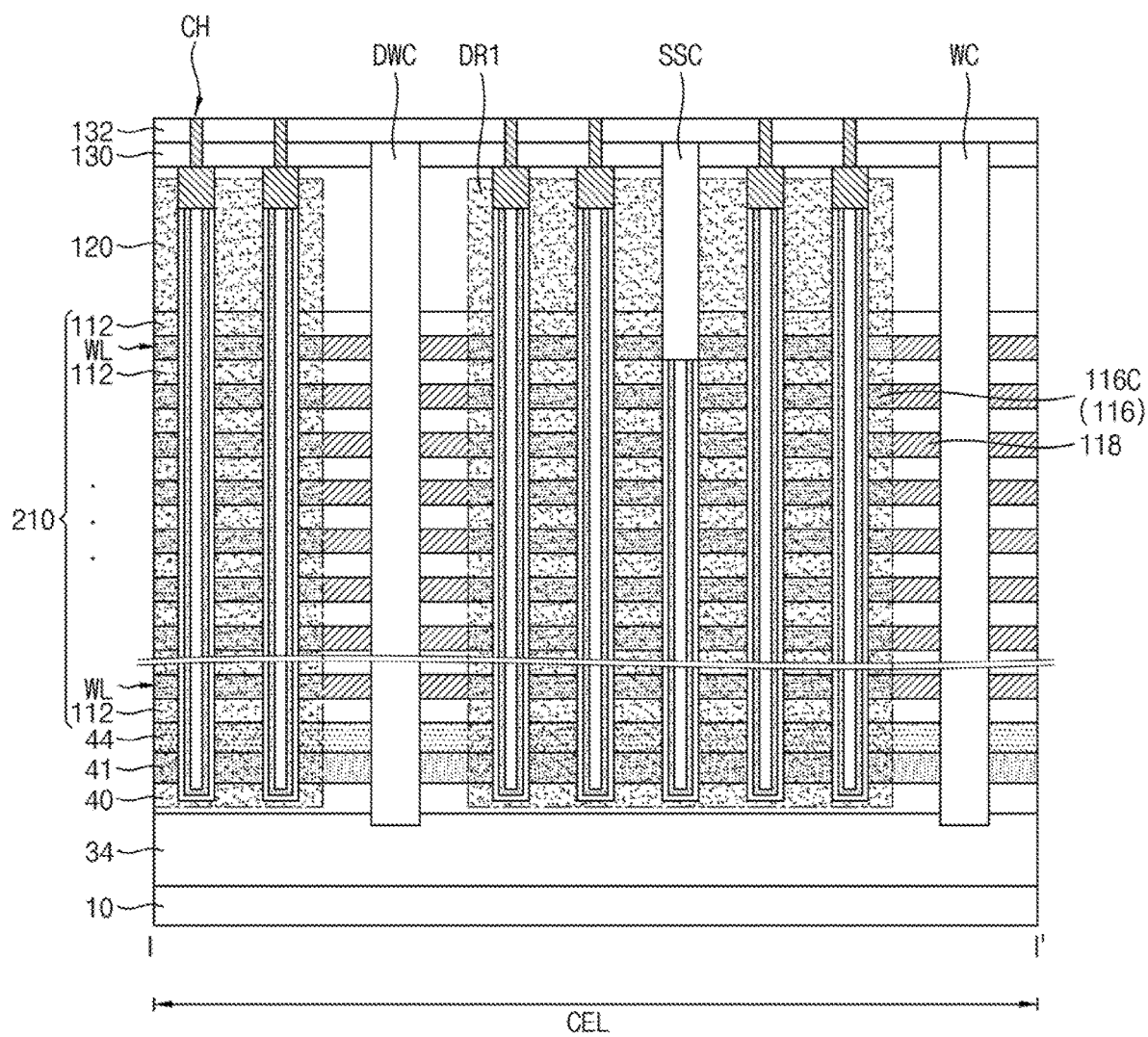
Figure 10B:
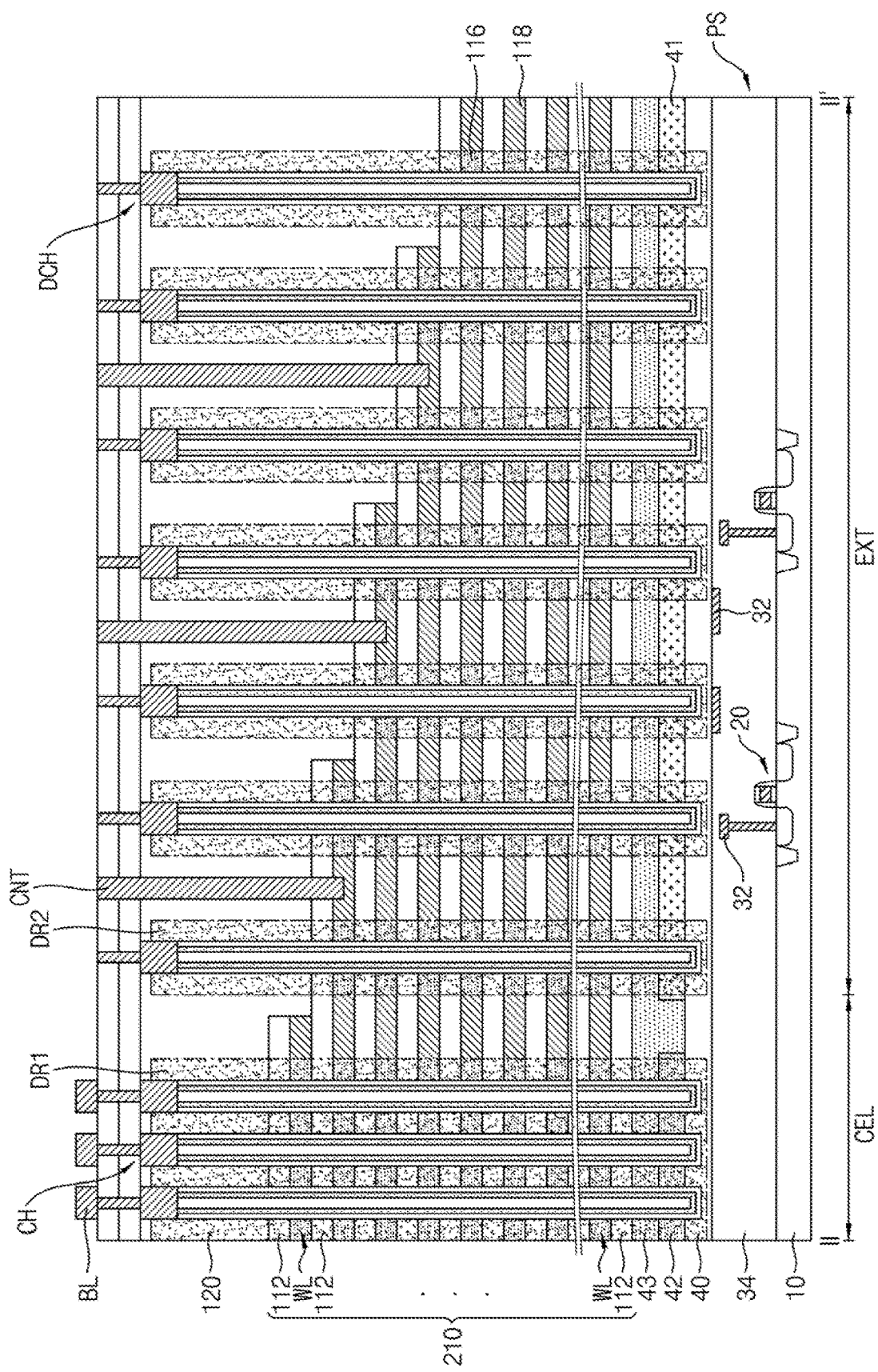

Referring to FIGS. 10A and 10B, the method may include forming a word line WL, forming a word line separation layer WC and a dummy word line separation layer DWC, forming a second capping layer 132, forming a bit line plug 160, forming a string selection line separation pattern SSC, forming a contact plug CNT, and forming a bit line BL.

Forming the word line WL may include forming an outer pattern 118 in the open region OP. The outer pattern 118 may fill the open region OP and may be between insulation layers 112 that are vertically adjacent to each other. The outer pattern 118 may be connected to a side surface of the inner pattern 116. In an implementation, the outer pattern 118 may include, e.g., of tungsten (W), tungsten nitride (WN), titanium (Ti), titanium nitride (TiN), tantalum (Ta), tantalum nitride (TaN), or a combination thereof.

The word line separation layer WC may be formed in the word line cut WLC, and the dummy word line separation layer DWC may be formed in the dummy word line cut DWLC. The word line separation layer WC and the dummy word line separation layer DWC may include, e.g., silicon oxide, silicon nitride, silicon oxynitride, or a combination thereof.

The second capping layer 132 may be formed on the first capping layer 130. The bit line plug 160 may be formed on the conductive pad 153 to pass through the first capping layer 130 and the second capping layer 132. The string selection line separation pattern SSC may be formed to pass through the string selection line SSL and the insulation layer 112, the interlayer insulation layer 120, the first capping layer 130, and the second capping layer 132 each disposed on the string selection line SSL. A contact hole, which vertically passes through the first capping layer 130, the second capping layer 132, and the interlayer insulation layer 120 and exposes a top or inner surface of the outer pattern 118, may be formed, and then, the contact plug CNT may be formed in the contact hole. The bit line BL may be formed on the second capping layer 132 in the cell region CEL and may be connected to the bit line plug 160.

By way of summation and review, in a 3D memory device using a word line including polysilicon, a punching phenomenon (where a word line pad is bored) could occur in forming a contact connected to the word line pad. Also, the word line including polysilicon may be low in mobility of carriers, causing an increase in a resistance.

One or more embodiments may provide a semiconductor device including polysilicon and metal.

One or more embodiments may provide a 3D memory device including a word line having a low resistance.

One or more embodiments may provide a 3D memory device including a word line for reducing the possibility of or preventing a punching phenomenon from occurring A word line of the 3D memory device according to an embodiment of the disclosure may include both polysilicon and a metal material, and thus, may have a low resistance.

The word line of the 3D memory device according to an embodiment of the disclosure may include a metal material at a pad part connected to a contact, thereby reducing or preventing the occurrence of a punching phenomenon.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A three-dimensional (3D) memory device, comprising:
   a substrate including a cell region and an extension region;
   a cell stack including a plurality of insulation layers and a plurality of word lines alternately stacked on the substrate;
   a plurality of channel structures vertically passing through the cell stack;
   a word line separation layer vertically passing through the cell stack and extending lengthwise in a first direction parallel to a surface of the substrate;
   a contact plug vertically connected to the plurality of word lines on the extension region; and
   a bit line extending lengthwise in a second direction orthogonal to the first direction on the plurality of channel structures,
   wherein:
   each of the plurality of word lines includes:
      an inner pattern including polysilicon; and
      an outer pattern including metal,
   the outer pattern surrounds an outer surface of the inner pattern,
   the plurality of channel structures vertically pass through the inner pattern, and
   the contact plug is on the outer pattern.

2. The 3D memory device as claimed in claim 1, wherein an outer surface of the outer pattern contacts the word line separation layer.

3. The 3D memory device as claimed in claim 1, wherein a portion of the outer pattern is between the inner pattern and the word line separation layer.

4. The 3D memory device as claimed in claim 1, wherein the inner pattern surrounds the plurality of channel structures and fills a region between the plurality of channel structures.

5. The 3D memory device as claimed in claim 1, wherein:
   the polysilicon of the inner pattern is doped with P-type impurities, and
   the outer pattern includes tungsten.

6. The 3D memory device as claimed in claim 1, wherein the inner pattern is spaced apart from the word line separation layer.

7. The 3D memory device as claimed in claim 1, wherein the inner pattern includes:
   a cell inner pattern on the cell region; and
   a plurality of dummy inner patterns on the extension region.

8. The 3D memory device as claimed in claim 7, further comprising a plurality of dummy channel structures vertically passing through the cell stack on the extension region,
   wherein the plurality of dummy inner patterns respectively surround the plurality of dummy channel structures.

9. The 3D memory device as claimed in claim 7, wherein the cell inner pattern includes an outer surface having an uneven shape.

10. The 3D memory device as claimed in claim 7, wherein the outer pattern includes a protrusion protruding toward the cell inner pattern.

11. The 3D memory device as claimed in claim 1, wherein:
    each of the plurality of word lines includes a string selection line at an uppermost level in the cell stack, and
    the 3D memory device further comprises a string selection line separation pattern physically separating the string selection lines of each of the plurality of word lines.

12. The 3D memory device as claimed in claim 1, wherein:
    each of the plurality of channel structures includes:
       a buried insulation pattern;
       a channel pattern surrounding a side surface of the buried insulation pattern;
       an information storage pattern surrounding a side surface of the channel pattern; and a conductive pad on the buried insulation pattern, the channel pattern, and the information storage pattern, and the information storage pattern contacts the inner pattern.

13. A three-dimensional (3D) memory device, comprising: a substrate including a cell region and an extension region; a cell stack including a plurality of insulation layers and a plurality of word lines, alternately stacked on the substrate, and having a staircase structure on the extension region; a plurality of cell channel structures vertically passing through the cell stack on the cell region; and a plurality of dummy channel structures vertically passing through the cell stack on the extension region, wherein: the plurality of word lines includes a plurality of inner patterns and a plurality of outer patterns surrounding outer surfaces of the plurality of inner patterns, the plurality of inner patterns on the cell region have an integrated plate shape, and the plurality of inner patterns on the extension region have a disk shape surrounding the plurality of dummy channel structures.

14. The 3D memory device as claimed in claim 13, wherein:
the plurality of inner patterns includes polysilicon doped with P-type impurities, and
the plurality of outer patterns includes metal.

15. The 3D memory device as claimed in claim 13, further comprising:
a word line separation layer vertically passing through the cell stack and extending lengthwise in a first direction parallel to a surface of the substrate; and
a contact plug vertically connected to the plurality of outer patterns on the extension region.

16. The 3D memory device as claimed in claim 15, wherein the plurality of outer patterns contacts the word line separation layer.

17. The 3D memory device as claimed in claim 15, wherein the plurality of inner patterns are apart from the word line separation layer.

18. A three-dimensional (3D) memory device, comprising:
a substrate including a cell region and an extension region;
a cell stack including a plurality of insulation layers and a plurality of word lines alternately stacked on the substrate;
a plurality of channel structures on the cell region to vertically pass through the cell stack;
a plurality of dummy channel structures on the extension region to vertically pass through the cell stack;
a word line separation layer vertically passing through the cell stack and extending lengthwise in a first direction parallel to a surface of the substrate;
a contact plug vertically connected to the plurality of word lines on the extension region; and
a bit line extending lengthwise in a second direction orthogonal to the first direction on the plurality of channel structures,
wherein:
each of the plurality of word lines includes a pad part arranged in a staircase structure on the extension region,
the pad part includes:
a plurality of dummy inner patterns each surrounding a portion of a sidewall of a corresponding dummy channel structure of the plurality of dummy channel structures; and
an outer pattern surrounding the plurality of dummy inner patterns,
in a plan view, the plurality of dummy inner patterns are apart from one another in the first direction and the second direction,
the outer pattern contacts the word line separation layer, and
the contact plug contacts the outer pattern.

19. The 3D memory device as claimed in claim 18, wherein:
the plurality of dummy inner patterns each include polysilicon with P-type impurities doped thereon, and
the outer pattern includes metal.

20. The 3D memory device as claimed in claim 18, wherein the plurality of dummy inner patterns are spaced apart from the word line separation layer.

* * * * *